(12) United States Patent
Zoppas et al.

(10) Patent No.: US 11,566,949 B2
(45) Date of Patent: Jan. 31, 2023

(54) METHOD AND DEVICE FOR MEASURING THE TEMPERATURE IN ELECTRIC POWER RESISTORS

(71) Applicant: I.R.C.A. S.P.A. INDUSTRIA RESISTENZE CORAZZATE E AFFINI, Vittorio Veneto (IT)

(72) Inventors: Federico Zoppas, Treviso (IT); Nicola Moret, Cortina d'Ampezzo (IT); Antonio De Moliner, Orderzo (IT); Michele Peterle, San Pietro di Feletto (IT); Michele Midrio, Udine (IT); Antonio Affanni, Cassalmaggiore (IT)

(73) Assignee: I.R.C.A. S.P.A. INDUSTRIA RESISTENZE CORAZZATE E AFFINI, San Vendemiano (IT)

( * ) Notice: Subject to any disclaimer, the term of this patent is extended or adjusted under 35 U.S.C. 154(b) by 455 days.

(21) Appl. No.: 16/637,086

(22) PCT Filed: Aug. 8, 2018

(86) PCT No.: PCT/IB2018/055967
§ 371 (c)(1),
(2) Date: Feb. 6, 2020

(87) PCT Pub. No.: WO2019/030690
PCT Pub. Date: Feb. 14, 2019

(65) Prior Publication Data
US 2020/0249098 A1 Aug. 6, 2020

(30) Foreign Application Priority Data
Aug. 8, 2017 (IT) .................. 102017000091796

(51) Int. Cl.
G01K 7/24 (2006.01)
G01R 27/26 (2006.01)
H05B 3/44 (2006.01)

(52) U.S. Cl.
CPC .......... *G01K 7/24* (2013.01); *G01R 27/2605* (2013.01); *H05B 3/44* (2013.01); *G01K 2217/00* (2013.01)

(58) Field of Classification Search
CPC ........ G01K 2217/00; G01K 7/16; G01K 7/24; G01R 27/2605; H05B 1/0269;
(Continued)

(56) References Cited

U.S. PATENT DOCUMENTS 4,698,583 A * 10/1987 Sandberg ................. H05B 1/02
219/544
5,975,756 A 11/1999 Jones
(Continued)

FOREIGN PATENT DOCUMENTS

CN 104271322 A 1/2015
WO 2006/108622 A1 10/2006
(Continued)

OTHER PUBLICATIONS

PCT/IB2018/055967—International Search Report and Written Opinion, dated Nov. 27, 2018.

*Primary Examiner* — Vinh P Nguyen
(74) *Attorney, Agent, or Firm* — Amster Rothstein & Ebenstein LLP (57) ABSTRACT

The present invention relates to a method and device for measuring the temperature in power resistors based on the measurement of the high-frequency circuit parameters of said resistor. The present invention excludes the use of thermocouples, dedicated temperature sensors or thermo chambers.

16 Claims, 7 Drawing Sheets

(58) Field of Classification Search
CPC ........ H05B 2203/014; H05B 2203/019; H05B 2203/02; H05B 3/44; F24H 9/2028
See application file for complete search history.

(56) References Cited

U.S. PATENT DOCUMENTS 9,345,067 B2 * 5/2016 Biller .................. H05B 1/0227
9,733,201 B2 * 8/2017 Zach .................. G01R 31/003

FOREIGN PATENT DOCUMENTS

| WO | 2011/044489 | A1 | 4/2011 |
| WO | 2013134610 | A1 | 9/2013 |

* cited by examiner

METHOD AND DEVICE FOR MEASURING THE TEMPERATURE IN ELECTRIC POWER RESISTORS

CROSS-REFERENCE TO RELATED APPLICATIONS

This application claims benefit to PCT application no. PCT/IB2018/055967, filed Aug. 8, 2018, which claims priority to Italian application no. IT 10 2017000091796, filed Aug. 8, 2017, the content of which are incorporated by reference in their entireties.

FIELD OF THE INVENTION

The present invention relates to the technical field of temperature measurement and is directed to a method and device for measuring the temperature of electric power resistors, in particular, but not exclusively, for tubular housed power resistors. The method and device according to the present invention allow avoiding the use of thermocouples or thermal sensors such as, for example, NTCs and PTCs, and the disadvantages connected thereto.

BACKGROUND ART

Electric power resistors, and in particular tubular housed electric power resistors, are employed as heating elements in numerous applications belonging to a wide spectrum of technical fields: energy production, industrial processes, machines for the transformation of plastics and industrial machinery in general, transport, air conditioning and domestic heating, collective catering, vending machines, professional washing and ironing, wellness, etc.

Tubular housed electric power resistors consist of a resistive wire (generally made of nickel-chromium or iron-chromium-aluminum) wound as a solenoid, which is welded, on both ends, to two cylindrical terminal pins. The structure comprising the welded wire and terminals is inserted inside a cylindrical tube made of metallic material (generally made of a steel alloy), called sheath, which constitutes the external structure of the tubular resistor.

The structure comprising the welded wire and terminals is then insulated from the sheath by interposing a suitable electrical insulator, generally magnesium oxide in granular form.

The magnesium oxide powder, by means of a suitable striation process, is then compacted inside the tube, so as to fill all the empty spaces: the empty spaces between the wire and the sheath, the empty spaces between the coils of the wire, and the empty spaces within each of the coils of the wire. Sometimes (not in all applications), a suitable sealing material is also added in a suitable groove obtained at the ends of the metal sheath so as to prevent the ingress of moisture inside the tube and the consequent reduction of the oxide insulation.

During operation, the tubular resistor is powered by applying an electric potential difference V between the two pins. Therefore, an electric current I, with a value proportional to the electric potential difference applied, flows inside the pins and the metal wire causing a power dissipation equal to $I^2R$ or to $V^2/R$, where R is the value of the resistance of the tubular resistor. This power dissipation provokes a thermal increase due to the Joule effect which causes the surrounding environment, or the medium in which the tubular resistor is immersed into, to heat up.

According to the most used methods for measuring the temperature of the sheath of the resistor, an operation which is necessary both during the assembly step as well as during the testing step and the operational step, welding a thermocouple on the surface of the sheath or applying a suitable sensor, such as an NTC or a PTC, or still using a thermo chamber is required. These methods are often difficult to implement, as it occurs in cases where thermocouples are used and the sheath is made of steel or the resistor is made by means of etched foil technology and the sheath is covered with a thin film of plastic material, or they require very expensive equipment, such as a thermo chamber, or still they are limited to a reduced range of temperatures, as it occurs in cases where thermal sensors, such as NTCs or PTCs, are employed.

Therefore, it is an object of the present invention to respond to the need to introduce a new system for measuring the temperature of power resistors which excludes the employment of thermocouples, thermo chambers or temperature sensors and solves the issues described above.

Further objects, features and advantages of the present invention will become more apparent from the following detailed description, given by way of explanation and not by way of limitation, and shown in the accompanying drawings, in which:

SUMMARY OF THE INVENTION

The present invention relates to a method and to a device for measuring the temperature in power resistors based on the measurement of the high-frequency circuit parameters of said resistor. The present invention excludes the use of thermocouples, dedicated temperature sensors or thermo chambers.

Figure 1:
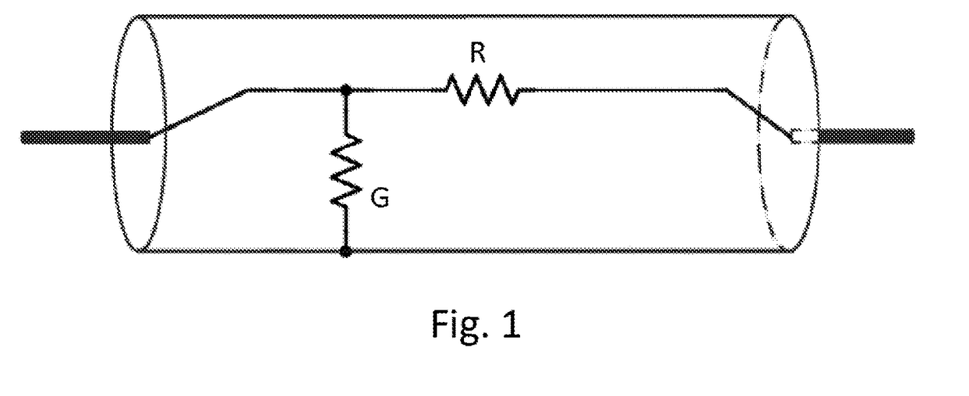
FIG. 1 shows the equivalent circuit of a power resistor which takes into account the low-frequency behavior of the resistor.
Figure 2:
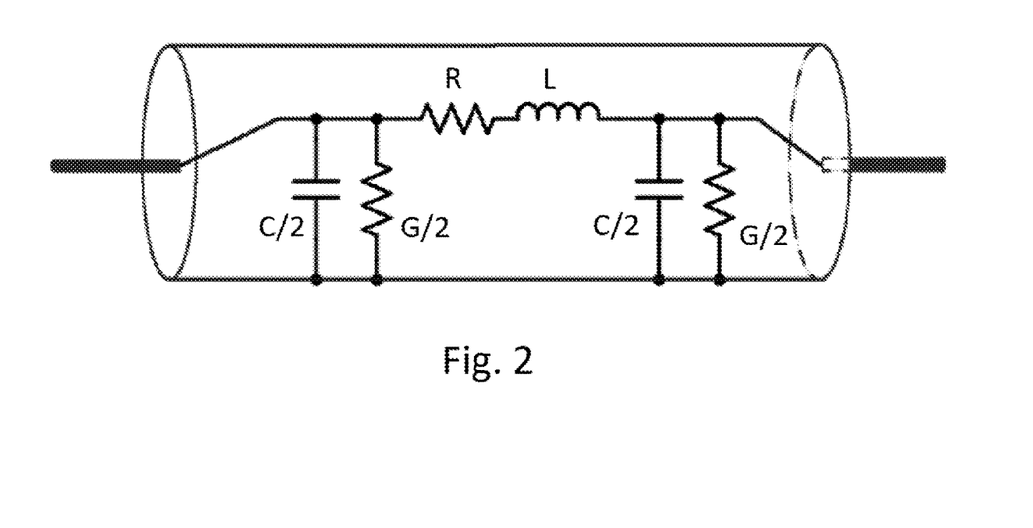
FIG. 2 shows the equivalent circuit of a power resistor which takes into account the high-frequency behavior of the resistor.

With reference to the equivalent circuits shown in FIGS. 1 and 2, a power resistor may be assimilated to a simple resistor only when low-frequency operation, i.e., for example, a nominal employment frequency, generally equal to 50 or 60 Hz, is considered. When, instead, a wider operating frequency range is considered, the equivalent circuit appears to be more complex, having to account not only for the electric power which results in heat due to the Joule effect, but also for the reactive power and the radiant power which at high frequencies are no longer negligible.

In greater detail, said low-frequency equivalent circuit comprises, in addition to the nominal resistance value R, a very small conductance value G, arranged between the terminals and the sheath of the resistor and relative to the properties of the insulator employed (for example, magnesium oxide).

The high-frequency equivalent circuit of the power resistor instead comprises, in general, a series impedance Z and a parallel admittance Y towards the sheath of the resistor as shown in the accompanying FIG. 2. Therefore, in addition to the nominal resistance value R and the conductance value G, there are a series inductance L, relative to the reactive behavior of the resistive wire employed inside the resistor and given in particular by the geometry of the coil in which said resistive wire is wound, and a capacitance C, between the terminals and the sheath of the resistor, which accounts for the reactive behavior of the insulator (for example, magnesium oxide) which is employed inside the sheath and is relative both to the properties of the dielectric employed and to the geometry of the resistor. Considering, for example, power resistors of the tubular type, the value of said capacitance C may be influenced by the diameter of the tube forming the sheath and also by the diameter of the coil in which the resistive wire located inside the sheath is wound. The high-frequency power resistor equivalent circuit shown in the accompanying FIG. 2 may be considered valid up to frequencies in the MHz range.

The high-frequency characterization of the resistor and of the resistance R thereof, as well as the calculation of the aforesaid parasitic parameters or high-frequency circuit parameters: the conductance G, the inductance L and the capacitance C, are operations which may be carried out with a certain accuracy. Since the aforesaid circuit parameters R, G, L and C show a certain dependence on the temperature of the resistor, the present invention wants to introduce a method and a device adapted to determine the temperature of a power resistor by measuring the circuit parameters characterizing the high-frequency resistor: the nominal resistance value of the wire of the resistor R, the conductance value between the terminals and the sheath G of the resistor, the inductance value of the wire of the resistor L and the capacitance value C between the terminals and the sheath of the resistor.

The device according to the present invention may be realized as a measuring tool, or it may advantageously be integrated into the driving and control circuit of the power resistor, or it may be realized as an element to be permanently connected to the resistor, possibly adapted to carry out the retrofitting of already produced and already installed resistors.

DETAILED DESCRIPTION OF THE INVENTION

In general, we have that the high-frequency circuit parameters of a power resistor—R, G, L and C—vary as a function of both frequency and temperature. Based on the trends of the aforesaid circuit parameters as a function of temperature, it is therefore possible to link the value of a circuit parameter of the power resistor to the temperature value of the resistor.

Figure 3:
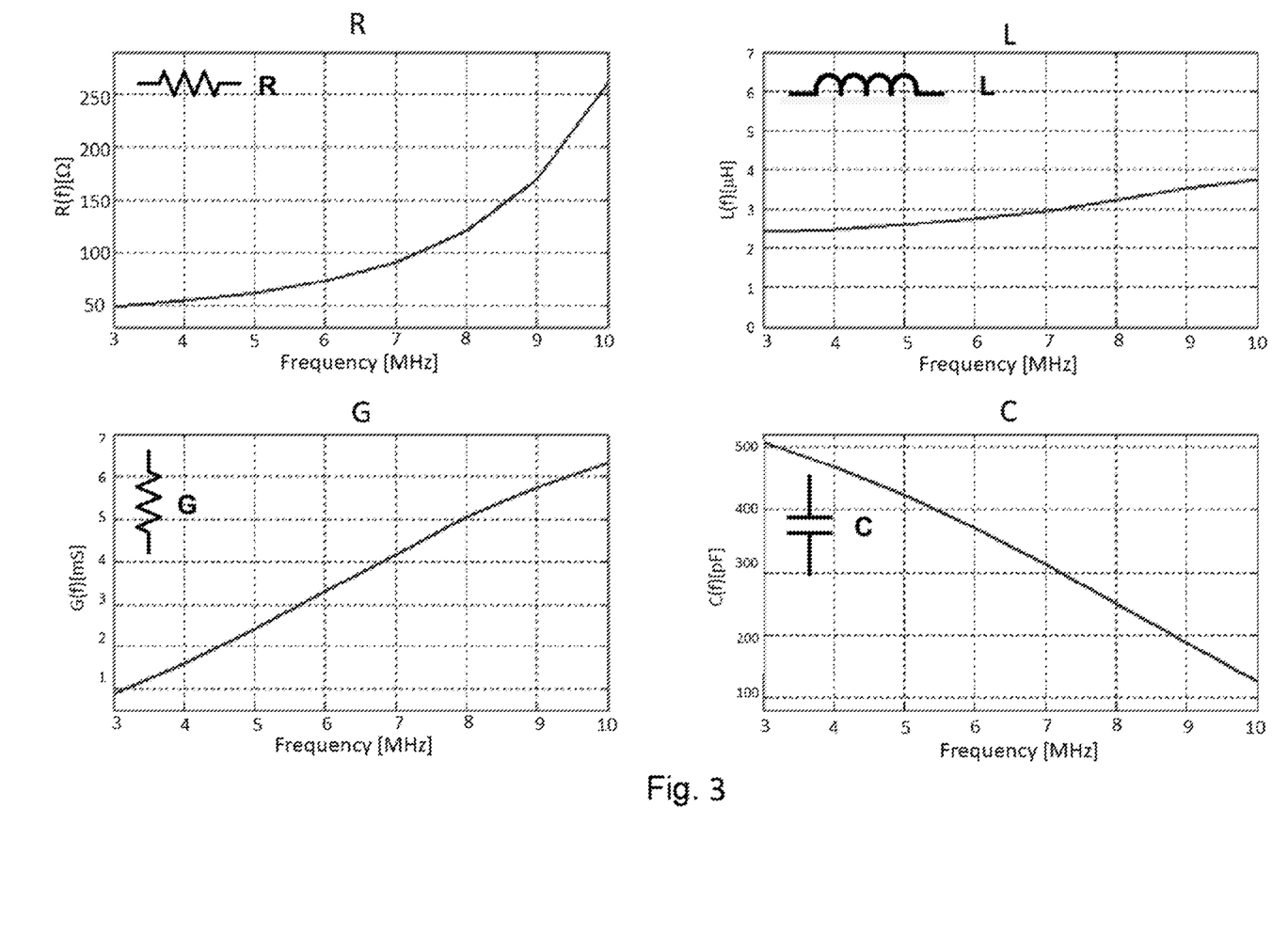
FIG. 3 shows the trends of the circuit parameters R, L, G and C of a 48 Ohm/1300 Watt tubular resistor as a function of frequency at a temperature of 22° C. and within a range of frequencies from 3 to 10 MHz.

The accompanying Figures from 3 to 6 show, by way of example, the trends of the aforesaid circuit parameters in the case of a 48 Ohm/1300 Watt tubular resistor. FIG. 3 shows the trends of the aforesaid circuit parameters R, L, G and C as a function of frequency at a temperature of 22° C. and within a range of frequencies from 3 to 10 MHz.

Figure 4:
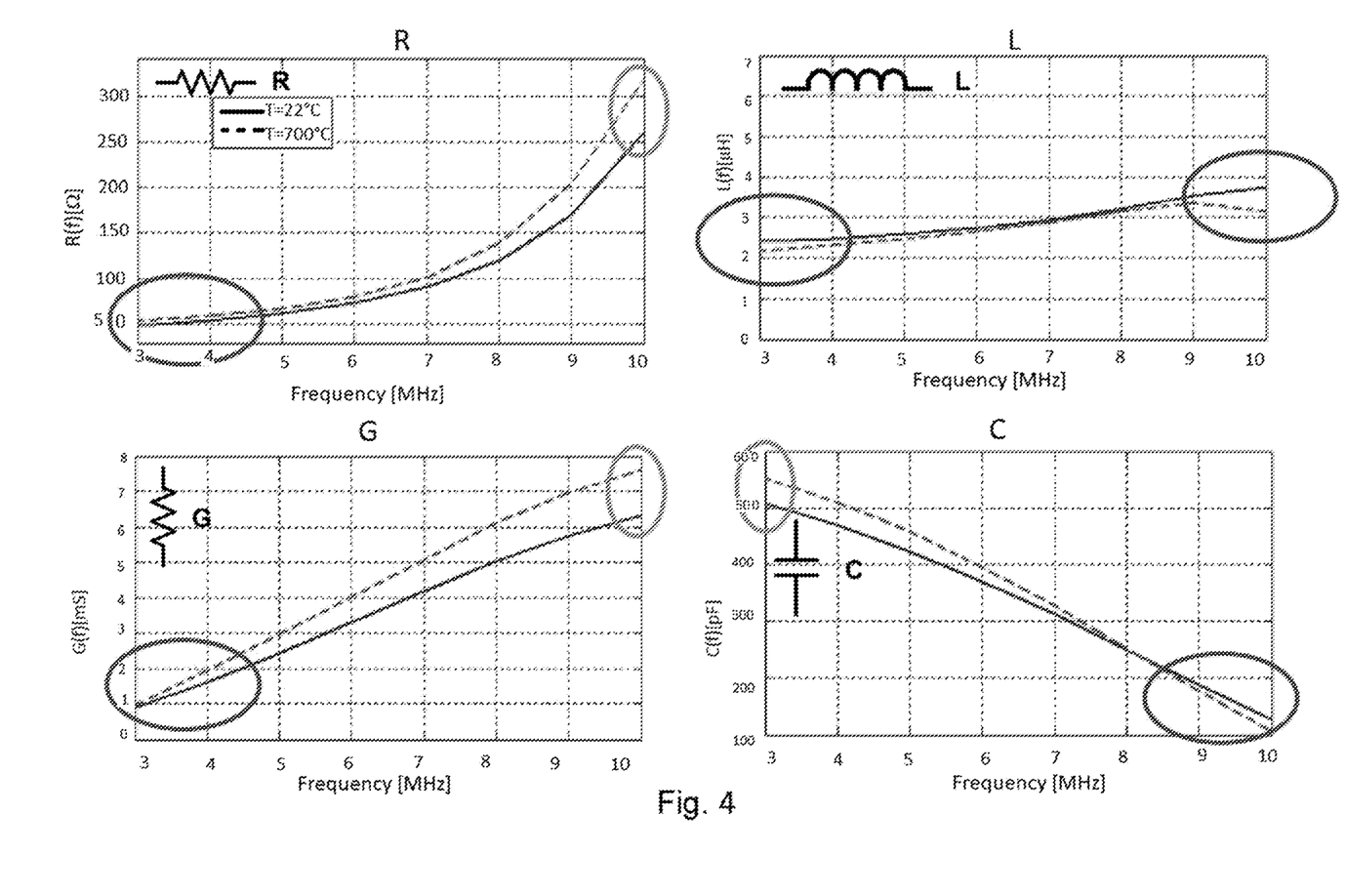
FIG. 4 shows the trends of the circuit parameters R, L, G and C of a 48 Ohm/1300 Watt tubular resistor as a function of frequency at a temperature of 22° C. and of 700° C. and within a range of frequencies from 3 to 10 MHz.

FIG. 4 shows a comparison of the trends of the aforesaid circuit parameters R, L, G and C as a function of frequency at a temperature of 22° C. and of 700° C. and within a range of frequencies from 3 to 10 MHz.

Figure 5:
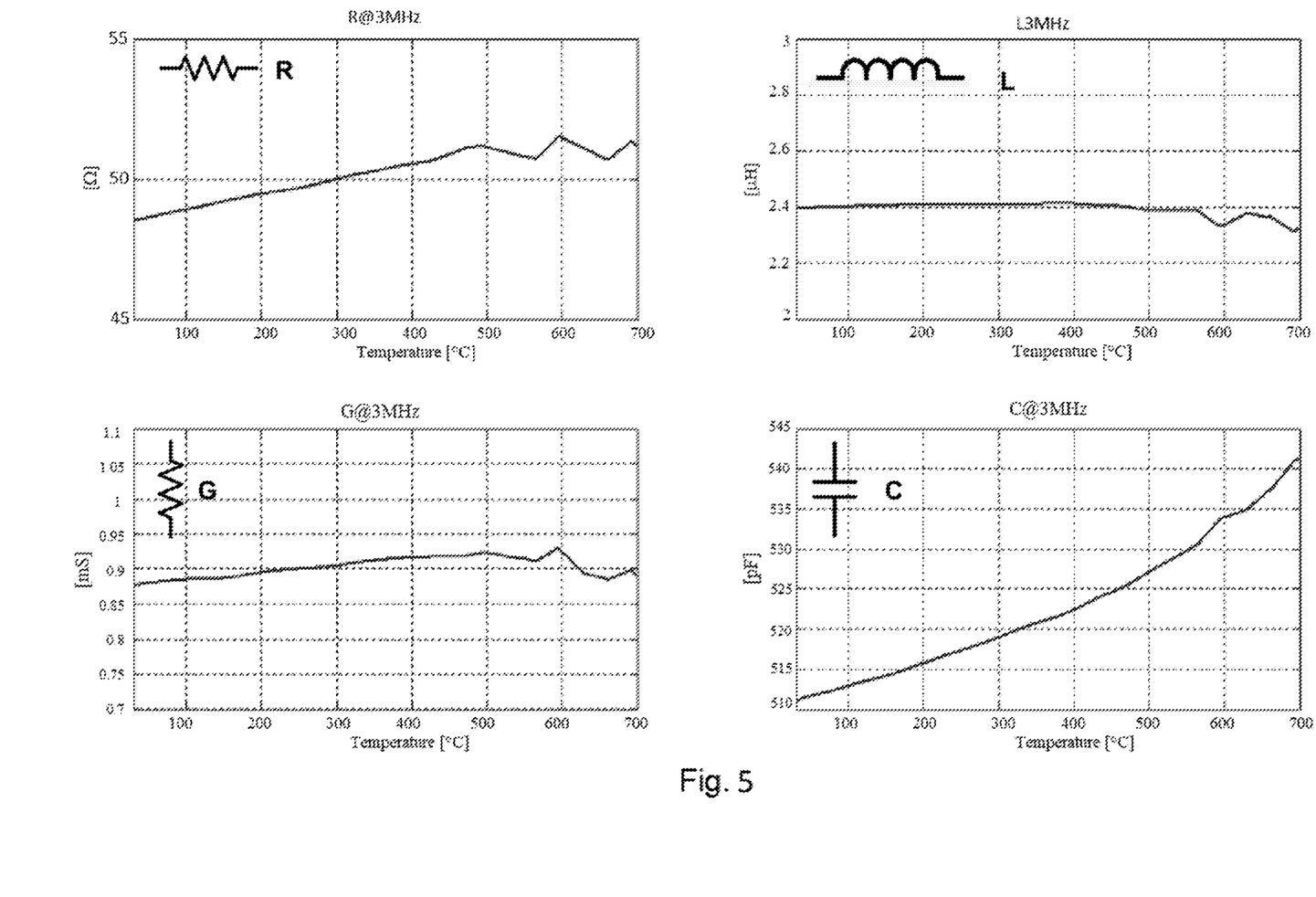
FIG. 5 shows the trends of the circuit parameters R, L, G and C of a 48 Ohm/1300 Watt tubular resistor as a function of temperature at a frequency of 3 MHz and within a range of temperatures from 0 to 700° C.

FIG. 5 shows the trends of the aforesaid circuit parameters R, L, G and C as a function of temperature at a frequency of 3 MHz and within a range of temperatures from 0 to 700° C.

Figure 6:
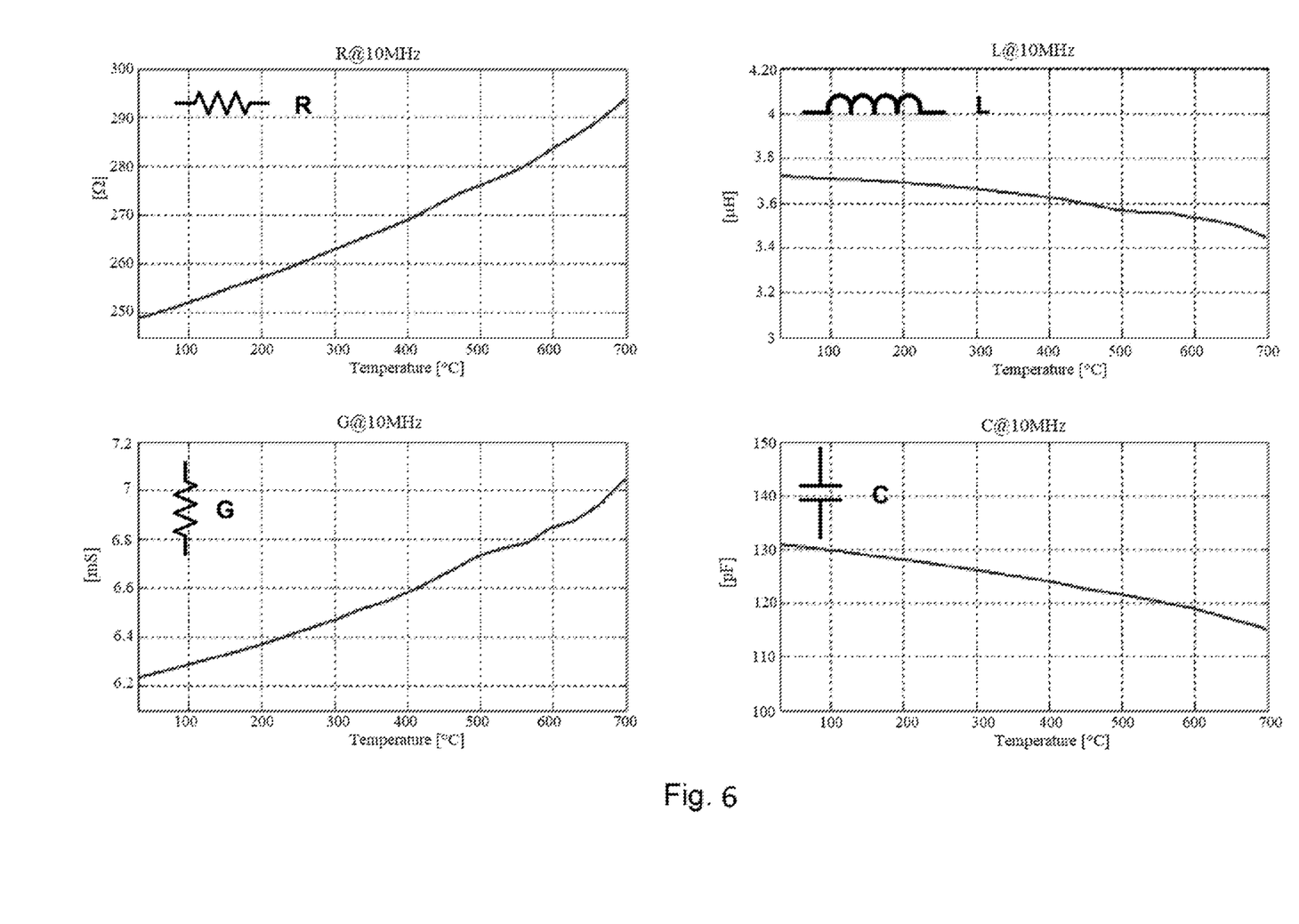
FIG. 6 shows the trends of the circuit parameters R, L, G and C of a 48 Ohm/1300 Watt tubular resistor as a function of temperature at a frequency of 10 MHz and within a range of temperatures from 0 to 700° C.

FIG. 6 shows the trends of the aforesaid circuit parameters R, L, G and C as a function of temperature at a frequency of 10 MHz and within a range of temperatures from 0 to 700° C.

From the analysis of the detected trends of the aforesaid circuit parameters R, L, G and C, it may be established with certainty that said parameters may be used to determine an accurate indication of the temperature of the resistor.

In particular, both the resistance R and the capacitance C have—with respect to the temperature and in a range from 0° C. to 700° C.—substantially linear trends characterized by a significant slope. In greater detail, the circuit parameter C shows, with respect to the temperature, a substantially linear increasing trend characterized by an accentuated slope at a frequency of around 3 MHz. Similarly, the circuit parameters R and G show, with respect to the temperature, a linear increasing trend characterized by an accentuated slope at a frequency of around 10 MHz. FIG. 4 shows the frequency values at which the spread between the values of the various circuit parameters of the resistors is greater. It is evident how the circuit parameters of the resistor, and in particular the parameters R, G and C, are suitable to provide a very accurate indication of the temperature of the resistor itself.

In the field of tubular power resistors, considering the dispersion of the aforesaid high-frequency circuit parameters, i.e., the range of values that said parameters have within a production batch of resistors which said parameters refer to, the parameter C, the parasitic capacitance between the filament and the sheath of the resistor, has a much more constant value, for example, than the parameter R, the resistance of the resistor.

With regard to tubular power resistors, the parameter C, the parasitic capacitance between the filament and the sheath of the resistor, thus represents the most accurate, stable and therefore most convenient parameter to be used for carrying out the indirect temperature measurement according to the present invention. For power resistors made with different technologies, materials and shapes, circuit parameters other than C, such as, for example, the resistance R or the conductance G, may be more suitable for carrying out the indirect temperature measurement according to the present invention.

A suitable conversion table, drawn up by means of the results of suitable measurements carried out on the power resistor, or a suitable mathematical function linking the value of the circuit parameters of the resistor to the corresponding temperature value, will eventually allow to translate the measured value of the parameter or of the circuit parameters of the resistor into the value of the temperature of the resistor.

Figure 7:
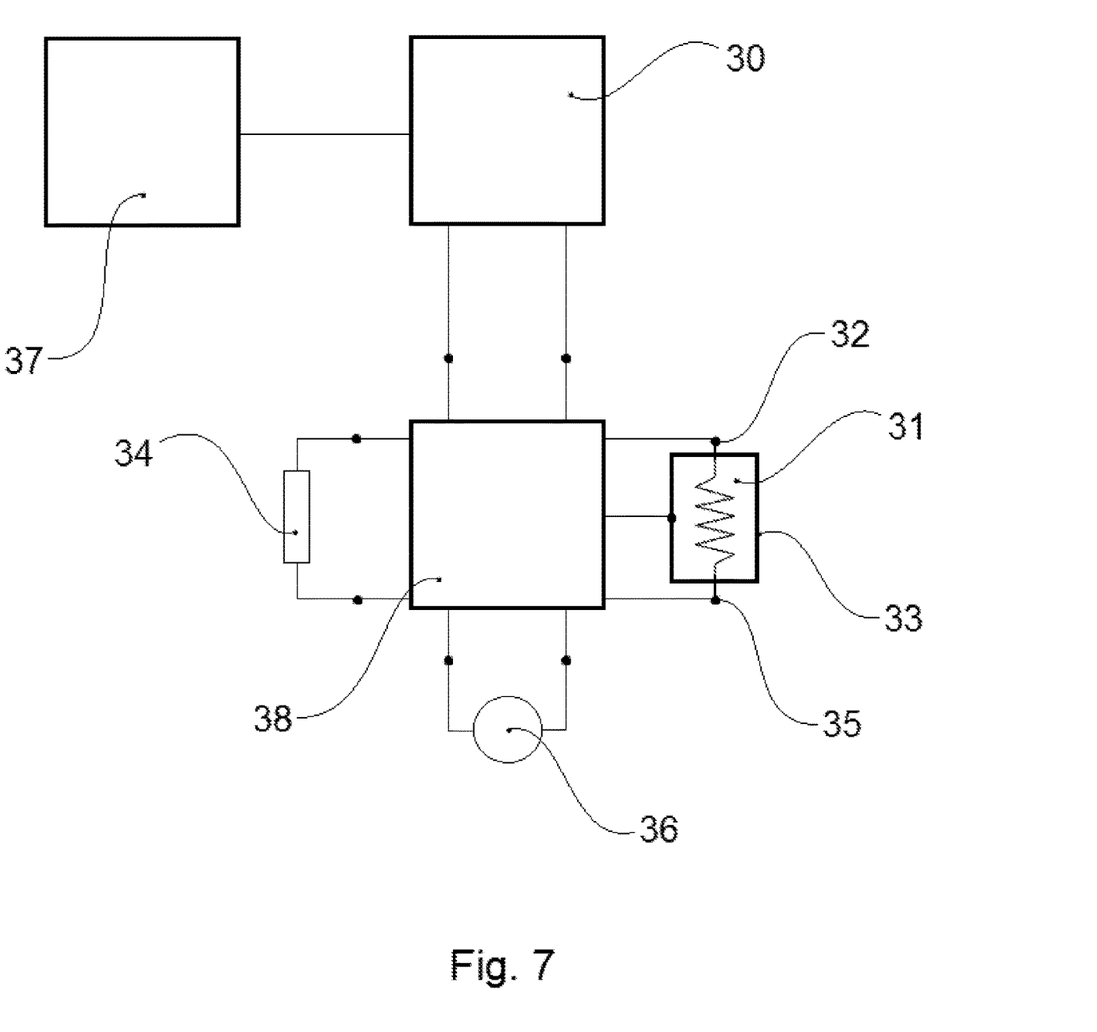
FIG. 7 shows the block diagram of a first preferred embodiment of the device according to the present invention.

A preferred embodiment of the present invention is shown in the accompanying FIG. 7, in which a power resistor 31 provided with a sheath 33 and with two terminals 32, 35, adapted to be connected to the terminals of a voltage or electric current source 36, is associated with means for measuring at least one high-frequency circuit parameter, indicated hereinafter for simplicity as impedance measuring means 30, by means of suitable connecting means 38. Said connecting means 38 provide for connecting the terminals of said impedance measuring means 30 between a first terminal 32 and the sheath 33 of said resistor 31, and to connect a load impedance 34 between a second terminal 35 and the sheath 33 of said resistor 31. In this preferred embodiment, with two measurements, the value of the resistance R of the resistor 31 and the value of the other high-frequency circuit parameters, the conductance G, the inductance L and the capacitance C, may be determined.

Advantageously, said connecting means 38 may comprise coupling means adapted to separate the high-frequency section of the device from the low-frequency section so as to prevent the low-frequency electric power which supplies the resistor 31 from interfering with the impedance measuring means 30, thus influencing the measurement. Said coupling means may, for example, comprise a low-pass filter in combination with a high-pass filter.

By realizing said impedance measuring means 30, for example, by means of a programmable frequency impedance meter, two distinct measurements may be carried out at different frequencies by connecting, by means of said connecting means, two different loads $Z_{L1}$ and $Z_{L2}$ 34 between the second terminal 35 and the sheath 33 of said resistor 31. Said known loads $Z_{L1}$ and $Z_{L2}$ 34 may also be an open circuit and a short circuit.

By indicating with Z the impedance of the resistor between the two terminals 32, 35, with Y the admittance between said terminals 32, 35 and the sheath 33, with Vin and Iin the voltage and the current dispensed by the impedance meter, with Vout and Iout the voltage and the current on said loads $Z_{L1}$ and $Z_{L2}$ 34 and by describing the resistor by means of an ABCD matrix we have that:

$$\begin{bmatrix} V_{in} \\ I_{in} \end{bmatrix} = \begin{bmatrix} A & B \\ C & D \end{bmatrix} \begin{bmatrix} V_{out} \\ I_{out} \end{bmatrix} = \begin{bmatrix} 1+YZ/2 & Z+YZ^2/4 \\ Y & 1+YZ/2 \end{bmatrix} \begin{bmatrix} V_{out} \\ I_{out} \end{bmatrix}$$

and $$Z_{in} = \frac{V_{in}}{I_{in}} = \frac{AZ_{out}+B}{CZ_{out}+D}.$$

By indicating with $Z_{L1}$ and $Z_{L2}$, as said, the known loads connected between the second terminal 35 and the sheath 33 of said resistor 31 in the two measurements, and with $Z_{M1}$ and $Z_{M2}$ the impedance values measured by the impedance meter in the two measurements carried out, we have that the admittance between said terminals 32, 35 and the sheath 33 is equal to:

$$Y = \pm \sqrt{\frac{-1}{\left[\frac{Z_{L2}Z_{M2}(Z_{L1}-Z_{M1})-Z_{L1}Z_{M1}(Z_{L2}-Z_{M2})}{(Z_{L1}-Z_{M1})-(Z_{L2}-Z_{M2})} - \left(\frac{Z_{L1}Z_{M1}-Z_{L2}Z_{M2}}{(Z_{L1}-Z_{M1})-(Z_{L2}-Z_{M2})}\right)^2\right]}}$$

while the impedance of the resistor between the two terminals 32, 35 is equal to:

$$Z = 2\left[\frac{Z_{L1}Z_{M1}-Z_{L2}Z_{M2}}{(Z_{L1}-Z_{M1})-(Z_{L2}-Z_{M2})} - \frac{1}{Y}\right].$$

Thereby, the value of the resistance R of the resistor and the value of the high-frequency parameters of conductance G, of inductance L and of capacitance C may be determined.

It should be noted that with the type of measurement described, it is possible to determine the high-frequency circuit parameters of a power resistor only by means of two distinct measurements.

Figure 8:
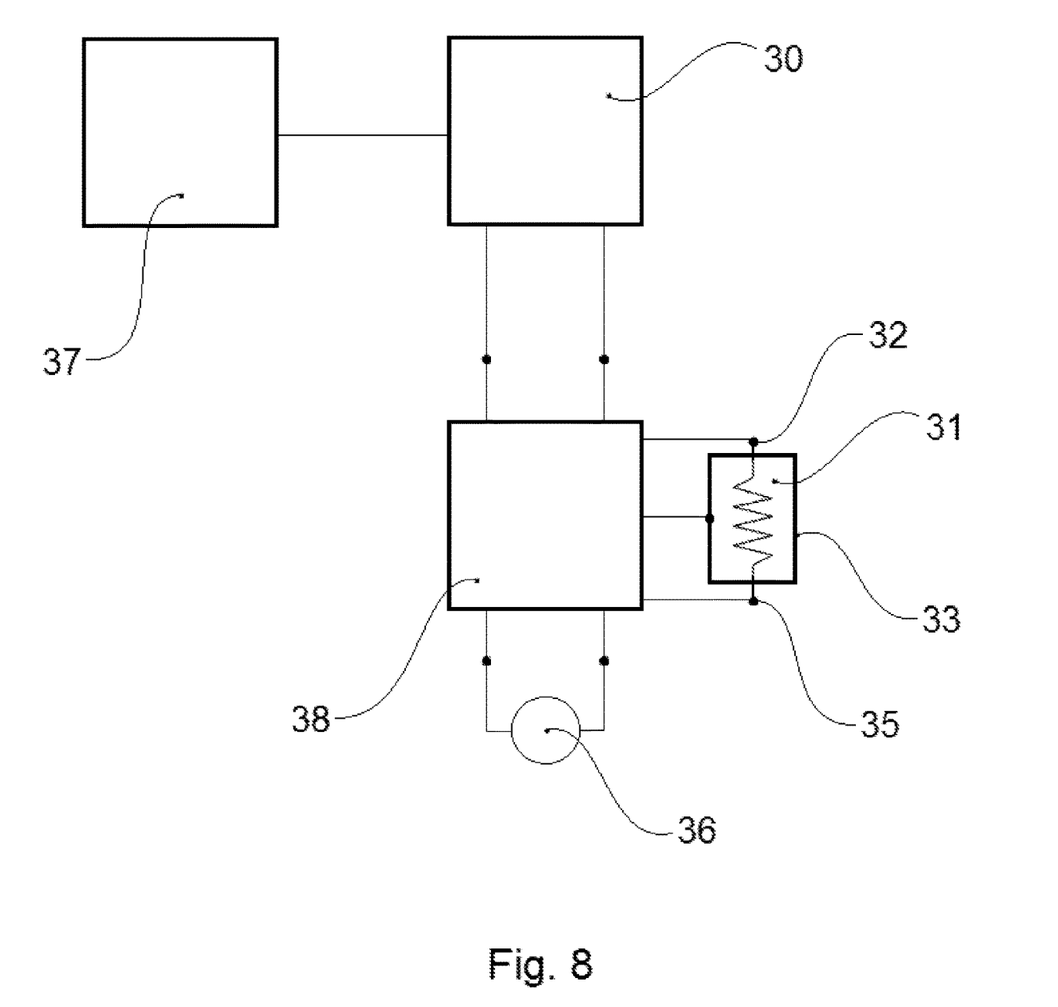
FIG. 8 shows the block diagram of a second preferred embodiment of the device according to the present invention.

In another preferred embodiment of the present invention, shown in the accompanying FIG. 8, said connecting means 38 are adapted to connect said resistor only to said voltage or electric current source 36 and to said impedance measuring means 30. Thereby, no further connection of said loads $Z_{L1}$ and $Z_{L2}$ 34 is required and the measurement to be carried out is only one. Said impedance measuring means 30 may, for example, be adapted to measure the resistance value of the filament of the resistor 31 R by means of a measurement of the module of the voltage and of the current relative to said resistance R, and the phase difference therebetween. Alternatively, said impedance measuring means 30 may comprise a capacitance meter. Said capacitance meter may be based on a dedicated integrated circuit or on a microcontroller provided with a technology capable of measuring capacitance values.

Advantageously, also in this case, said connecting means 38 may comprise coupling means adapted to electrically filter said impedance measuring means 30, i.e., the high-frequency section, from said voltage or electric current source 36, i.e., the low-frequency section, so as to prevent the low-frequency electric power which supplies the resistor 31 from interfering with the impedance measuring means 30, thus influencing the measurement. Said coupling means may, for example, comprise a low-pass filter in combination with a high-pass filter.

In another preferred embodiment of the present invention, shown in the accompanying FIG. 8, said connecting means 38 are adapted to alternately connect said resistor only to said voltage or electric current source 36 and to said impedance measuring means 30 so as to carry out the measurement after the resistor has been insulated from the nominal power supply circuit. Thereby, no further connection of said loads $Z_{L1}$ and $Z_{L2}$ 34 is required and the measurement to be carried out is only one. Carrying out the measurement after the resistor has been insulated from the nominal power supply circuit allows to avoid possible interferences in the measurement circuit due to the voltage or electric current source 36. Said impedance measuring means 30 may advantageously be adapted to measure the resistance value of the filament of the resistor 31, R, by means of a measurement of the module of the voltage and of the current relative to said resistance R, and the phase difference therebetween.

This preferred embodiment of the present invention may be immediately applied to the various fields of employment of common power resistors, also by virtue of the fact that said power resistors, during the normal operation thereof, are very often powered in intermittent ON/OFF mode so as to modulate the power employed for the heating and therefore the temperature of the environment or of the medium in which said resistors are inserted.

In another preferred embodiment of the present invention, said impedance measuring means 30 consist of an electric capacitance meter and said connecting means 38 are adapted to alternately connect said resistor to said voltage or electric current source 36 and to said electric capacitance meter which may be based on a dedicated integrated circuit or on a microcontroller provided with a technology capable of measuring capacitance values.

In another preferred embodiment of the present invention, said impedance measuring means 30 consist of a high-frequency signal generator associated with said resistor 31, by means of said connecting means 38, so as to power the RC circuit in which R is the resistance of the inner filament of the resistor 31 and C is the capacitance present between the terminals 32, 35 of the resistor 31 and the sheath 33 thereof. In this preferred embodiment of the present invention, the oscillation frequency of the aforesaid RC circuit is detected so as to determine the value of the parameters R and C and, therefore, the current temperature value of the power resistor 31.

The device according to the present invention, adapted to measure the temperature of a power resistor 31 provided with a sheath 33 and with two terminals 32, 35 for the connection to the terminals of a voltage or electric current source 36, therefore, comprises in the most general embodiment thereof:

impedance measuring means 30, connecting means 38 adapted to connect the terminals 32, 35 and the sheath 33 of a power resistor 31 to said impedance measuring means 30 and the terminals 32, 35 of said power resistor 31 to said voltage or electric current source 36;

control and reading means 37 adapted to read the value of at least one high-frequency circuit parameter of said resistor 31 measured by said impedance measuring means 30, to carry out the conversion between the value of at least one measured high-frequency circuit parameter and the temperature.

Advantageously, the present invention may further comprise suitable user interface means, associated with said control and reading means 37, and adapted to show the obtained temperature value.

Said control and reading means 37 may further comprise a microcontroller adapted to host possible tables for the conversion between the measure circuit parameters and the temperature and possible conversion functions between the measure circuit parameters and the temperature.

Finally, said control and reading means 37, may be advantageously integrated into the power control circuit of said power resistor 31 so as to manage, for example, the measurement steps within the periods of temporary shut-down of the power supply of the resistor 31.

Although the present invention has been described and disclosed with reference to specific preferred embodiments, it is to be understood that, within the scope of protection defined by the following claims, all possible variants are included, which are within the reach of those skilled in the art.

The invention claimed is:

1. A device for measuring a temperature value of a power resistor through measurement of parasitic parameters of the power resistor, the power resistor having a sheath which circumscribes a resistive element terminating at opposing first and second resistor terminals and adapted to be connected to power terminals of a voltage or electric current source, the device comprising:

an impedance measuring means adapted to measure at least one parasitic parameter of said resistor at a predetermined frequency, said at least one parasitic parameter being chosen in a group comprising L, series inductance of said resistor, G, conductance measured between the two resistor terminals and the sheath of said resistor and C, capacitance measured between the first and second resistor terminals and the sheath of said power resistor;

a connecting means adapted to connect the two resistor terminals and the sheath of a power resistor to said impedance measuring means and to connect the two resistor terminals of said power resistor to said voltage or electric current source;

a control and reading means adapted to read the value of said at least one parasitic parameter of said resistor measured by said impedance measuring means and adapted to carry out conversion between the value of at least one measured parasitic parameter and the temperature value of the power resistor through a predetermined look-up table and/or a predetermined mathematical function defining values of the parasitic parameters of said power resistor to a corresponding temperature value.

2. The device according to claim 1, further comprising a user interface means including a display, said user interface means being in electronic communications with said control and reading means, and adapted to show the temperature value of the power resistor.

3. The device according to claim 1, wherein said connecting means comprise coupling means adapted to prevent the low-frequency electric power which supplies the resistor from interfering with the impedance measuring means, thus influencing the measurement.

4. The device according to claim 3, wherein said coupling means comprise a low-pass filter in combination with a high-pass filter.

5. The device according to claim 1, wherein said connecting means are further adapted to connect said impedance measuring means between the first terminal and the sheath of said resistor and to connect a load impedance between the second terminal and the sheath of said resistor.

6. The device according to claim 1, wherein said connecting means are adapted to alternately connect said resistor to said voltage or electric current source and to said impedance measuring means.

7. The device according to claim 1, wherein said impedance measuring means are adapted to measure the resistance value of a filament of the resistor, R.

8. The device according to claim 7, wherein said impedance measuring means are adapted to measure the resistance value of the filament of the resistor, R, by means of a measurement of a module of the voltage value and of the current value relative to said filament, and the phase difference therebetween.

9. The device according to claim 1, wherein said impedance measuring means comprise a capacitance meter.

10. The device according to claim 9, wherein said capacitance meter comprises a dedicated integrated circuit or a microcontroller adapted to measure capacitance values.

11. The device according to claim 1, wherein said control and reading means comprise a microcontroller adapted to host tables for the conversion between the measured parasitic parameters of said resistor and the temperature or an experimentally determined conversion function linking said measured circuit parameters and the temperature.

12. The device according to claim 1, wherein said control and reading means are integrated in a power control circuit of said power resistor.

13. A method for measuring the temperature of a power resistor provided with a sheath and with terminals by using a device as in claim 1, the method comprising the following steps:

a) providing impedance measuring means, b) connecting said impedance measuring means between at least one of said terminals and said sheath, c) reading the value measured by said impedance measuring means at a predetermined frequency, d) carrying out the conversion between the value measured by said impedance measuring means and the temperature through a predetermined look-up table and/or a predetermined mathematical function defining values of the parasitic parameters of said power resistor to a corresponding temperature value.

14. The method for measuring the temperature of a power resistor according to claim 13, wherein said step of (a) providing impedance measuring means, (b) connecting said impedance measuring means and (c) reading the value measured by said impedance measuring means comprise:

α) connecting a first load impedance, $Z_{L1}$, between a second terminal of said terminals and said sheath, β) reading the value measured by said impedance measuring means, $Z_{M1}$, at a predetermined frequency, γ) disconnecting the first load impedance, $Z_{L1}$, δ) connecting a second load impedance, $Z_{L2}$, between a second terminal of said terminals and said sheath, ε) reading the value measured by said impedance measuring means, $Z_{M2}$, at a predetermined frequency, ζ) calculating the impedance, Z, of the resistor between the two terminals, and the admittance, Y, between said terminals and the sheath, through the values $Z_{L1}$, $Z_{M1}$, $Z_{L2}$, and $Z_{M2}$, η) calculating at least one parasitic parameter L, G or C of said resistor (31) from the impedance, Z, or admittance, Y, values, and wherein said step (d) of carrying out the conversion comprises:

j) carrying out the conversion between the value of said at least one parasitic parameter L, G or C of said resistor and temperature.

15. The method for measuring the temperature of a power resistor according to claim 14, wherein in said step (η), the admittance, Y and the impedance, Z are calculated according to the equations:

$$Y = \pm \sqrt{\frac{-1}{\left[\frac{Z_{L2}Z_{M2}(Z_{L1} - Z_{M1}) - Z_{L1}Z_{M1}(Z_{L2} - Z_{M2})}{(Z_{L1} - Z_{M1}) - (Z_{L2} - Z_{M2})} - \left(\frac{Z_{L1}Z_{M1} - Z_{L2}Z_{M2}}{(Z_{L1} - Z_{M1}) - (Z_{L2} - Z_{M2})}\right)^2\right]}}, \text{ and}$$

$$Z = 2\left[\frac{Z_{L1}Z_{M1} - Z_{L2}Z_{M2}}{(Z_{L1} - Z_{M1}) - (Z_{L2} - Z_{M2})} - \frac{1}{Y}\right].$$

16. The method for measuring the temperature of a power resistor (31) according to claim 13, wherein said impedance measuring means comprises a capacitance meter.

* * * * *